(12) United States Patent
Lee

(10) Patent No.: US 7,061,407 B1
(45) Date of Patent: Jun. 13, 2006

(54) ENCODING OF 8B10B CONTROL CHARACTERS

(75) Inventor: Hyun Soo Lee, Sunnyvale, CA (US)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 11/151,935

(22) Filed: Jun. 14, 2005

(51) Int. Cl.
*H03M 7/00* (2006.01)

(52) U.S. Cl. .......................... 341/50; 341/78; 341/106

(58) Field of Classification Search ................. 341/50, 341/59, 81, 67, 63, 62, 78, 106; 709/247
See application file for complete search history.

(56) References Cited

U.S. PATENT DOCUMENTS

| | | | |
|---|---|---|---|
| 5,930,399 A * | 7/1999 | Kadyk et al. | 382/245 |
| 6,181,821 B1 * | 1/2001 | Lim | 382/232 |
| 6,275,587 B1 * | 8/2001 | Amerige | 380/255 |
| 6,484,167 B1 * | 11/2002 | Tarlano | 707/6 |
| 6,867,713 B1 * | 3/2005 | Tsang | 341/58 |
| 6,915,352 B1 * | 7/2005 | Ho et al. | 709/246 |

* cited by examiner

*Primary Examiner*—Peguy JeanPierre
(74) *Attorney, Agent, or Firm*—LeRoy D. Maunu

(57) ABSTRACT

An encoder includes a first storage array having a first set of values, a second storage array having a second set of values, and a selection circuit. Each of the first and second storage arrays have address ports coupled to receive a first or second portion of an input value, and are adapted to output a first or second value of the first or second set in response to a value of the first or second portion of the input value, respectively. The selection circuit has input ports coupled to the first storage array, to the second storage array, and for receiving the input value. The selection circuit is adapted to output the second value from the second storage array as an encoded value of the input value or the first value from the first storage array as the encoded value.

17 Claims, 6 Drawing Sheets

| 8b/10b control character | octet value | GFP value |
|---|---|---|
| K28.0 | 1C | 0000 |
| K28.1 | 3C | 0001 |
| K28.2 | 5C | 0010 |
| K28.3 | 7C | 0011 |
| K28.4 | 9C | 0100 |
| K28.5 | BC | 0101 |
| K28.6 | DC | 0110 |
| K28.7 | FC | 0111 |
| K23.7 | F7 | 1000 |
| K27.7 | FB | 1001 |
| K29.7 | FD | 1010 |
| K30.7 | FE | 1011 |

FIG. 2

| address | data |
|---|---|
| 0 | 1111 |
| 1 | 0000 |
| 2 | 1111 |
| 3 | 0001 |
| 4 | 1111 |
| 5 | 0010 |
| 6 | 1111 |
| 7 | 0011 |
| 8 | 1111 |
| 9 | 0100 |
| A | 1111 |
| B | 0101 |
| C | 1111 |
| D | 0110 |
| E | 1111 |
| F | 1111 |

FIG. 4A

| address | data |
|---|---|
| 0 | 1111 |
| 1 | 1111 |
| 2 | 1111 |
| 3 | 1111 |
| 4 | 1111 |
| 5 | 1111 |
| 6 | 1111 |
| 7 | 1000 |
| 8 | 1111 |
| 9 | 1111 |
| A | 1111 |
| B | 1001 |
| C | 0111 |
| D | 1010 |
| E | 1011 |
| F | 1111 |

FIG. 4B

ENCODING OF 8B10B CONTROL CHARACTERS

FIELD OF THE INVENTION

The present invention generally relates to encoding of 8B10B control characters.

BACKGROUND

Many communication protocols use data that is encoded using an 8b/10b encoding scheme. The 8b/10b encoding scheme encodes 8 bits of data into 10 bits of encoded data. In addition to encoding data, the 8b/10b encoding scheme permits a limited number of control characters to be encoded. For each of the 256 possible values for 8 bits of data and each of the typically 12 possible control characters, the 8b/10b encoding scheme has one, or a pair of, corresponding 10 bit encodings.

The 8b/10b encoding scheme permits the data and control codes to be communicated over communication media in a manner that is band limited and is run-length limited. The communication media may be copper cable, fiber optic cable, or traces on a printed circuit board.

The 8b/10b encoding scheme is band limited because the frequency components of a signal encoded using the 8b/10b encoding scheme are limited to a band of frequencies, and this band of frequencies does not include a DC component. The band limiting may reduce the distortion of the signal by the communication media due to dispersion of the various frequency components. The lack of a DC component may permit capacitive coupling of the signal.

The limited run-length and associated high transition density of the 8b/10b encoding scheme may permit a phase locked loop to recover from a received signal the clock used to transmit the signal. Because a separate clock signal may not be needed, the 8b/10b encoding scheme may reduce the number of signals needed to transmit data over a communication media.

The control characters of the 8b/10b encoding scheme are typically used to encode protocol data, such as transmitter-receiver synchronization, protocol initialization, control packet framing, and data packet framing. While many communication standards use the 8b/10b encoding scheme, such as Ethernet, Infiniband, and PCI Express, the meanings assigned to the control characters and control information generally vary between the various standards.

The generic framing procedure (GFP) is an emerging standard, ITU-T G.7041/Y.1303, for converting into a data stream the low-level encoded protocol data for various communication standards that use the 8b/10b encoding scheme. The data stream includes both the data and the control characters of the 8b/10b encoding scheme. The low-level encoded protocol data is remotely reconstructed from the data stream, typically after the data stream is transferred over a telecommunication network. GFP permits various communication standards using the 8b/10b encoding scheme to be transparently transported over a telecommunication network.

Part of the GFP is conversion of the format of the control characters from a format for the 8b/10b encoding scheme into a GFP format. There is a general need to efficiently convert between formats that represent control characters in an 8b/10b encoding using a reduced amount of logic and to complete a conversion between formats in a short period of time.

The present invention may address one or more of the above issues.

SUMMARY OF THE INVENTION

Various embodiments of the invention provide an encoder including a first storage array, a second storage array, and a selection circuit. The first storage array is configured with a first set of values and the second storage array configured with a second set of values. The first storage array has an address port coupled to receive a first portion of an input value, and is adapted to output a first value of the first set in response to a value of the first portion of the input value. The second storage array has an address port coupled to receive a second portion of the input value, and is adapted to output a second value of the second set in response to a value of the second portion of the input value. The selection circuit has input ports coupled to the first storage array, and the second storage array. The selection circuit is adapted to output the second value from the second storage array as an encoded value of the input value in response to the first portion having a third value, output the first value from the first storage array as the encoded value in response to the first portion not having the third value and the second portion having a fourth value, and output a default value as the encoded value in response to the first portion not having the third value and the second portion not having the fourth value.

Various other embodiments of the invention provide a method for encoding an 8-bit input value into an n-bit encoded value, wherein n is greater than or equal to four. A first value addressed by a first portion of the 8-bit input value is read from a first storage array. A second value addressed by a second portion of the 8-bit input value is read from a second storage array. The second value is output as the n-bit encoded value in response to the first portion having a third value. The first value is output as the n-bit encoded value in response to the first portion not having the third value and the second portion having a fourth value. A default value is output as the n-bit encoded value in response to the first portion not having the third value and the second portion not having the fourth value.

It will be appreciated that various other embodiments are set forth in the Detailed Description and claims which follow.

BRIEF DESCRIPTION OF THE DRAWINGS

Various aspects and advantages of the invention will become apparent upon review of the following detailed description and upon reference to the drawings in which:

FIG. 2 is a table of values of the control characters of an 8b/10b encoding in various formats in accordance with various embodiments of the invention;

FIGS. 4A and 4B are tables of the values for the storage arrays of a circuit for converting the format of a control character of an 8b/10b encoding in accordance with various embodiments of the invention;

DETAILED DESCRIPTION

Figure 1:
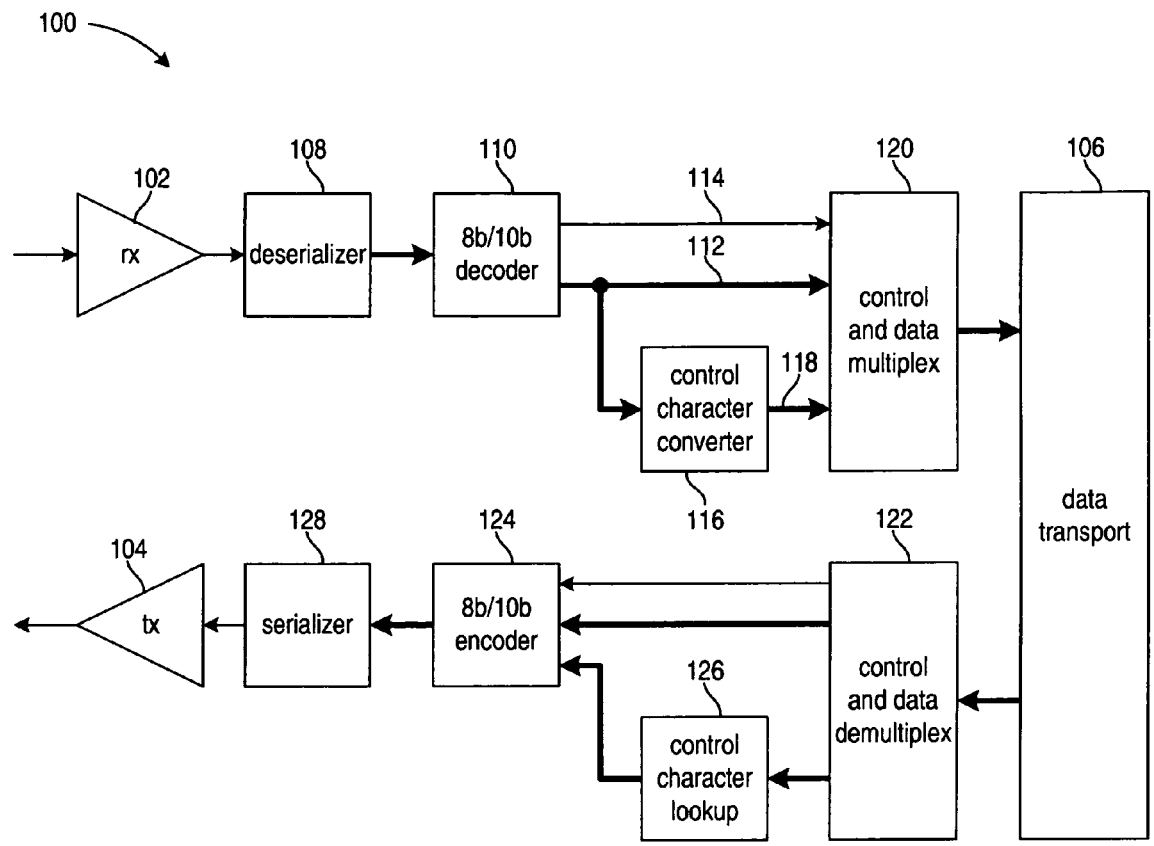
FIG. 1 is a block diagram of a transceiver using 8b/10b encoded data in accordance with various embodiments of the invention.

FIG. 1 is a block diagram of a transceiver 100 using 8b/10b encoded data in accordance with various embodiments of the invention. A receiver 102 may receive 8b/10b encoded data and a transmitter 104 may transmit 8b/10b encoded data. Transceiver 100 converts the 8b/10b encoded data transferred by receiver 102 and transmitter 104 between the 8b/10b encoding and another encoding for data transport 106. In one embodiment, transceiver 100 converts the 8b/10b encoded data according to a generic framing procedure for transfer on a data transport 106 that is a telecommunications network. The generic framing procedure may convert the 8b/10b encoded data, including control characters in the 8b/10b encoded data, into a data stream that is transferred by a data transport 106. A remote transceiver, which may be similar to transceiver 100, may convert the data stream back into 8b/10b encoded data.

Typically, 8b/10b encoded data is serially received by receiver 102 one bit at a time. Deserializer 108 may collect a sequence of the serially received bits to form one or more code words each containing 10-bits of 8b/10b encoded data. The 8b/10b decoder 110 may convert each 10-bit code word into a corresponding 8-bit data value. For a 10-bit code word corresponding to a data character the 10-bit code word is converted into the 8-bit value for the data character. For a 10-bit code word corresponding to one of the twelve control characters of the 8b/10b encoding, the 10-bit code word is converted into a corresponding 8-bit value for the control character. For both data characters and control characters the corresponding 8-bit value is output from the 8b/10b decoder 110 on line 112, and a character type signal on line 114 indicates whether the 8-bit value on line 112 is for a data character or a control character. It will be appreciated that transceiver 110 may include additional receiver functions not shown, such as recovery of a clock from the received 8b/10b encoded data, synchronization of the bit alignment of code words, and detection of invalid code words.

A control character converter 116 may convert the 8-bit value on line 112 into another encoding. In one embodiment, the 8-bit value on line 112 for a control character is converted into a 4-bit value on line 118 as specified by the generic framing procedure (GFP) of emerging standard, ITU-T G.7041/Y.1303. In another embodiment, the 8-bit value on line 112 for a control character is converted into an n-bit value, such as a proprietary n-bit value having four or more bits. Control and data multiplexer 120 may generate a data stream including the 8-bit value for each 8b/10b data character and the 4-bit GFP value for each 8b/10b control character. Control and data multiplexer 120 may use the character type on line 114 to determine whether to accept the 8-bit value on line 112 for a data character or the 4-bit GFP value on line 118 for a control character.

A data stream from a remote transceiver (not shown) is provided to the control and data demultiplexer 122 from data transport 106. The 8-bit value for a data character is provided directly to the 8b/10b encoder 124 from the demultiplexer 122 and the 4-bit GFP value for a control character from the demultiplexer 122 is converted to an 8-bit value by the control character lookup 126. The 8b/10b encoder converts the 8-bit value for data and control characters into a corresponding 10-bit value. Certain data and control characters may have two possible 10-bit values, and the 8b/10b encoder may select a 10-bit value that reduces the running disparity between the number of transmitted zero bits and the number of transmitted one bits. The serializer 128 may convert one or more 10-bit code words received in parallel from the 8b/10b encoder into a serial bit stream for transmission by transmitter 104.

FIG. 2 is a table of values of the control characters of an 8b/10b encoding in various formats in accordance with various embodiments of the invention. The 8b/10b encoding has twelve control characters with standard designations shown in column 150. Each control character has a corresponding 8-bit value shown in column 152 and one or two 10-bit encodings (not shown). In addition, each control character has a 4-bit GFP value shown in column 154 as a binary value.

The 8-bit values shown in column 152 may result from the decoding of the 10-bit encoded values for control characters using the same circuitry that is used for decoding of the 10-bit encoded values for data characters of the 8b/10b encoding. Each of the 8-bit values shown in column 152 is a two-digit hexadecimal value that has a most significant hexadecimal digit of "F", and/or a least significant hexadecimal digit of "C". For the "K28.7" control character of row 156, the 8-bit value shown in column 152 has a most significant hexadecimal digit of "F" and a least significant hexadecimal digit of "C".

Figure 3:
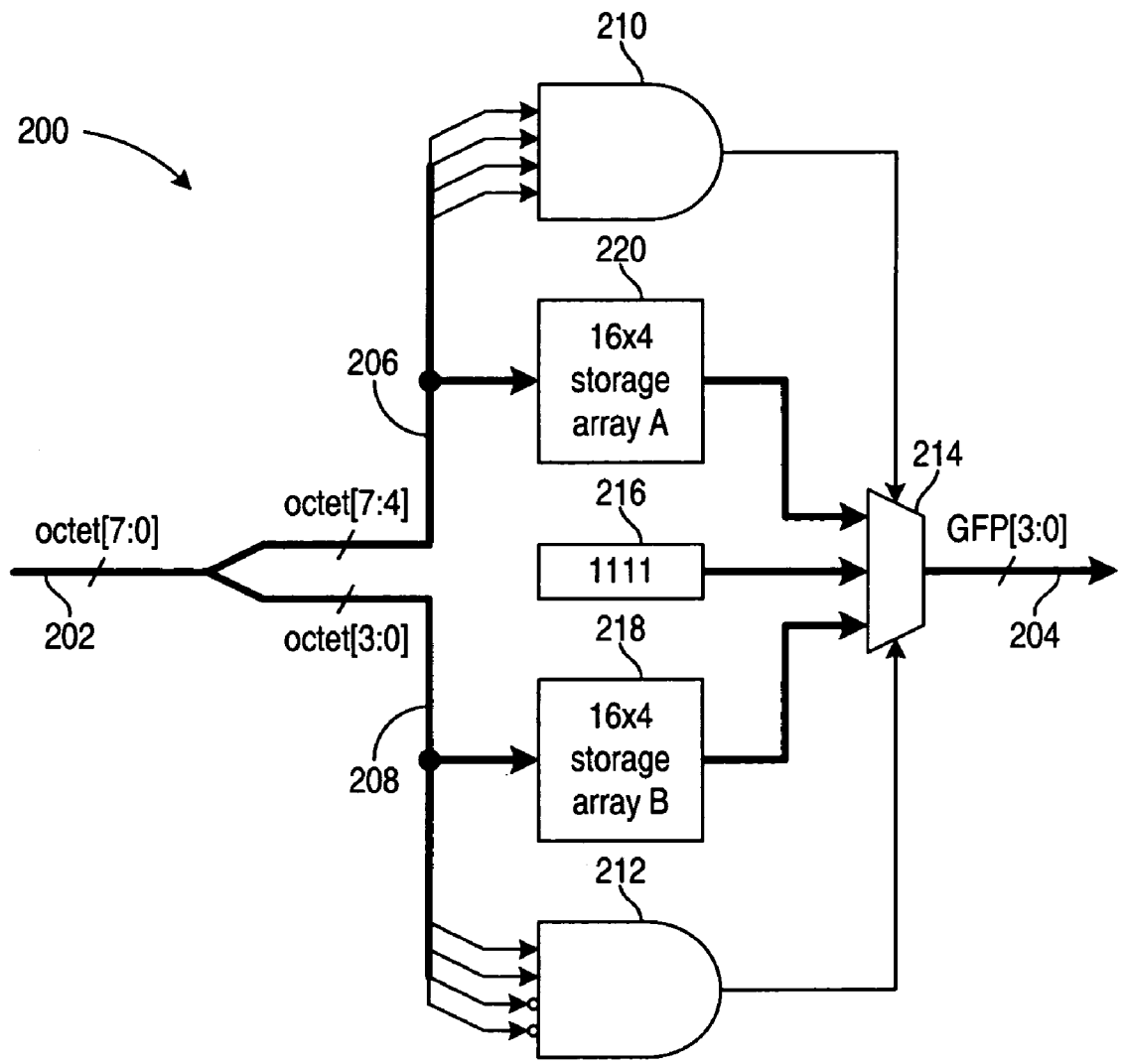
FIG. 3 is a block diagram of a circuit for converting the format of a control character of an 8b/10b encoding in accordance with various embodiments of the invention.

FIG. 3 is a block diagram of a circuit 200 for converting the format of a control character of an 8b/10b encoding in accordance with various embodiments of the invention. The 8-bit value of a control character is received on line 202 and the corresponding converted value is driven on line 204. In one embodiment, the converted value for valid control characters is the corresponding 4-bit encoded value for a GFP as shown in column 154 of FIG. 2. It will be appreciated that other encoded values may be produced on line 204 in another embodiment. In addition, circuit 200 may receive an 8-bit value on line 202 that does not correspond to a control character, such as the 8-bit value of certain data characters, and then the encoded value produced on line 204 may indicate an invalid control character.

The 8-bit value received on line 202 is split into the four most significant bits on line 206 and the four least significant bits on line 208. AND gate 210 receives the four most significant bits on line 206 to provide a match circuit that determines whether the four most significant bits on line 206 correspond to a hexadecimal value of "F". AND gate 212 with two inverting inputs receives the four least significant bits on line 208 to provide a match circuit that determines whether the four least significant bits on line 208 correspond to a hexadecimal value of "C".

Multiplexer 214 is a selection circuit that has two control inputs from the AND gates 210 and 212. If the AND gate 210 does not indicate that the four most significant bits of the 8-bit value on line 202 correspond to a hexadecimal value of "F" and the AND gate 212 does not indicate that the four least significant bits of the 8-bit value on line 202 correspond to a hexadecimal value of "C" then the 8-bit value on line 202 cannot be any one of the twelve 8-bit values in column 152 of FIG. 2 for a control character. In this case when the 8-bit value on line 202 does not have a four most significant bits with hexadecimal value "F" and does not have a four least significant bits with hexadecimal value of "C", the multiplexer 214 outputs the default value 216 on line 204. It will be appreciated that the default value 216 may be generated within multiplexer 214 and multiplexer 214 may not have an input for the default value 216. Generally the default value 216 is a value that does not correspond to the encoded value for a control character to indicate an invalid control character. For the GFP, the default value 216 may be any value not included in column 154 of FIG. 2, for example, the decimal values of twelve, thirteen, fourteen, and fifteen. Typically for the GFP, the default value 216 is a value of decimal fifteen, which corresponds to a binary value of "1111" and a hexadecimal value of "F".

When the AND gate 210 indicates that that the 8-bit value on line 202 has the four most significant bits with hexadecimal value of "F", then the 8-bit value on line 202 may be one of the bottom five control characters shown in the table of FIG. 2. The control input of multiplexer 214 from AND gate 210 may cause multiplexer 214 to output on line 204 a value from storage array 218 when the AND gate 210 indicates that that the 8-bit value on line 202 has the four most significant bits of hexadecimal "F". The value from the storage array 218 is one of sixteen values addressed by the four least significant bits of the 8-bit value on line 202.

Similarly, when the AND gate 212 indicates that the 8-bit value on line 202 has the four least significant bits of hexadecimal "C", then the 8-bit value on line 202 may be one of the top eight control characters shown in the table of FIG. 2. The control input of multiplexer 214 from AND gate 212 may cause multiplexer 214 to output on line 204 a value from storage array 220 when the AND gate 212 indicates that that the 8-bit value on line 202 has the four least significant bits of hexadecimal "C". The value from the storage array 220 is addressed by the four most significant bits of the 8-bit value on line 202. For the case when the 8-bit value on line 202 has a hexadecimal value of "FC", the multiplexer 214 may output on line 204 a value from storage array 218 in one embodiment and a value from storage array 220 in another embodiment.

FIGS. 4A and 4B are tables of the values for the storage arrays of a circuit for converting the format of a control character of an 8b/10b encoding in accordance with various embodiments of the invention. The values of column 252 may be the set of values stored in the storage array 220 of FIG. 3 with each of the values of column 252 stored in storage array 220 at a location addressed by the corresponding value in column 254. Similarly, the values of column 256 may be the set of values stored in the storage array 218 of FIG. 3 with each of the values of column 256 stored in storage array 218 at a location addressed by the corresponding value in column 258.

The values in column 256 are either the default value of "1111" or the GFP values in column 154 of FIG. 2 for which the value in column 152 of FIG. 2 has a most significant hexadecimal digit of "F". The last five rows of the table of FIG. 2 have a value in column 152 that has a most significant hexadecimal digit of "F". For each of the last five rows of the table of FIG. 2, an address value is provided by the least significant hexadecimal digit of the value in column 152 and a GFP value is provided by the value in column 154. For each of these five pairings of an address value and a GFP value, FIG. 4B has the GFP value in column 256 in the row having the address value in column 258. FIG. 4B has the default value in column 256 in the remaining rows.

The values in column 252 are either the default value of "1111" or certain of the GFP values in column 154 of FIG. 2 for which the value in column 152 of FIG. 2 has a least significant hexadecimal digit of "C". The first seven rows of the table of FIG. 2 have a value in column 152 that has a least significant hexadecimal digit of "C". For each of the first seven rows of the table of FIG. 2, an address value is provided by the most significant hexadecimal digit of the value in column 152 and a GFP value is provided by the value in column 154. For each of these seven pairings of an address value and a GFP value, FIG. 4A has the GFP value in column 252 in the row having the address value in column 254. FIG. 4A has the default value in column 252 in the remaining rows.

Row 156 in FIG. 2 has a value in column 152 of "FC" which has both a most significant hexadecimal digit of "F" and a least significant hexadecimal digit of "C". Referring back to FIG. 3, for an input octet 202 of "FC", storage array 220 receives an address "F" and storage array 218 receives an address of "C". Multiplexer 214 may select the value from storage array 218 in one embodiment for an input octet 202 of "FC". Thus, the value in storage array 220 at address "F" corresponding to value 260 of FIG. 4A is ignored and may have any value. In another embodiment, multiplexer 214 of FIG. 3 may instead select the value from storage array 220 for an input octet 202 of "FC", and value 260 of FIG. 4A should be "0111" and value 262 of FIG. 4B is ignored may be any value.

Figure 5:
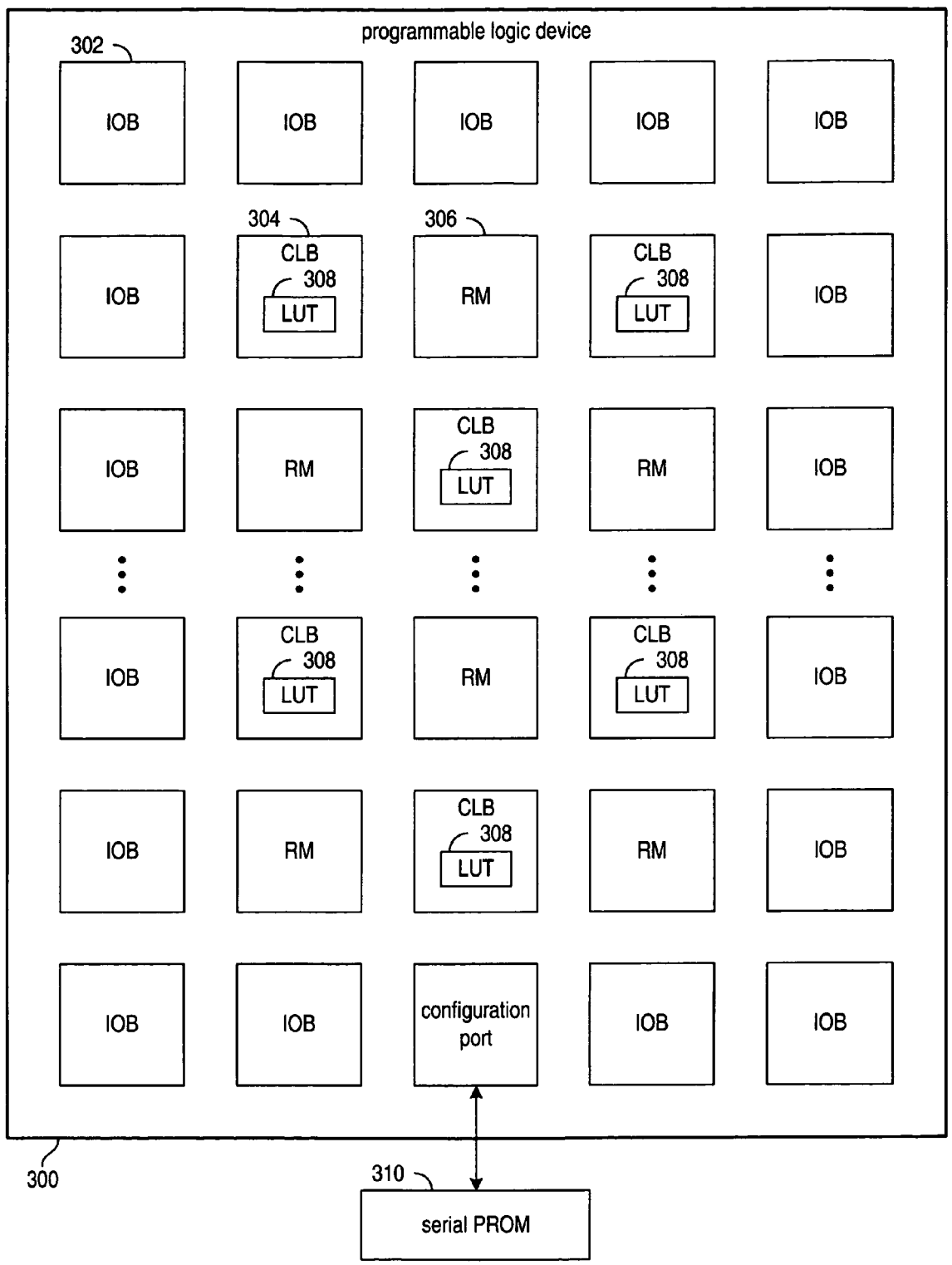
FIG. 5 is a block diagram of a programmable logic device (PLD) including configurable resources in accordance with various embodiments of the invention.

FIG. 5 is a block diagram of a programmable logic device (PLD) 300 including configurable resources in accordance with various embodiments of the invention. The configurable resources include configurable input/output blocks 302, configurable logic blocks (CLB) 304, and configurable routing matrices 306. Certain or all CLB 304 may include a lookup-table (LUT) 308.

Typically, each LUT 308 may be configured by programming data from serial PROM 310 to implement any possible logic function of the inputs to the LUT 308. For example, a LUT 308 may have a 4-bit input used to select and output one of sixteen 1-bit values in the LUT 308. Appropriate configuration of the sixteen 1-bit values in the LUT 308 permits the LUT 308 to implement any 1-bit logic function of the 4-bit input. Parallel LUTs 308 may implement any n-bit function of a 4-bit input.

Referring back to FIG. 3, storage arrays 218 and 220 may each be four parallel LUTs 308. AND gate 210 and AND gate 212 (including the inverting inputs) may each be a LUT 308. Multiplexer 214 (without default input 216) may be four parallel LUTs 308. Thus, circuit 200 of FIG. 3 may be implemented in PLD 300 of FIG. 5 using 14 LUTs 308 interconnected by routing matrices 306. This 14 LUT implementation of circuit 200 provides fast conversion because merely two successive LUT look-up time delays are required to convert the 8-bit value on line 202 into a 4-bit GFP value on line 204.

Figure 6:
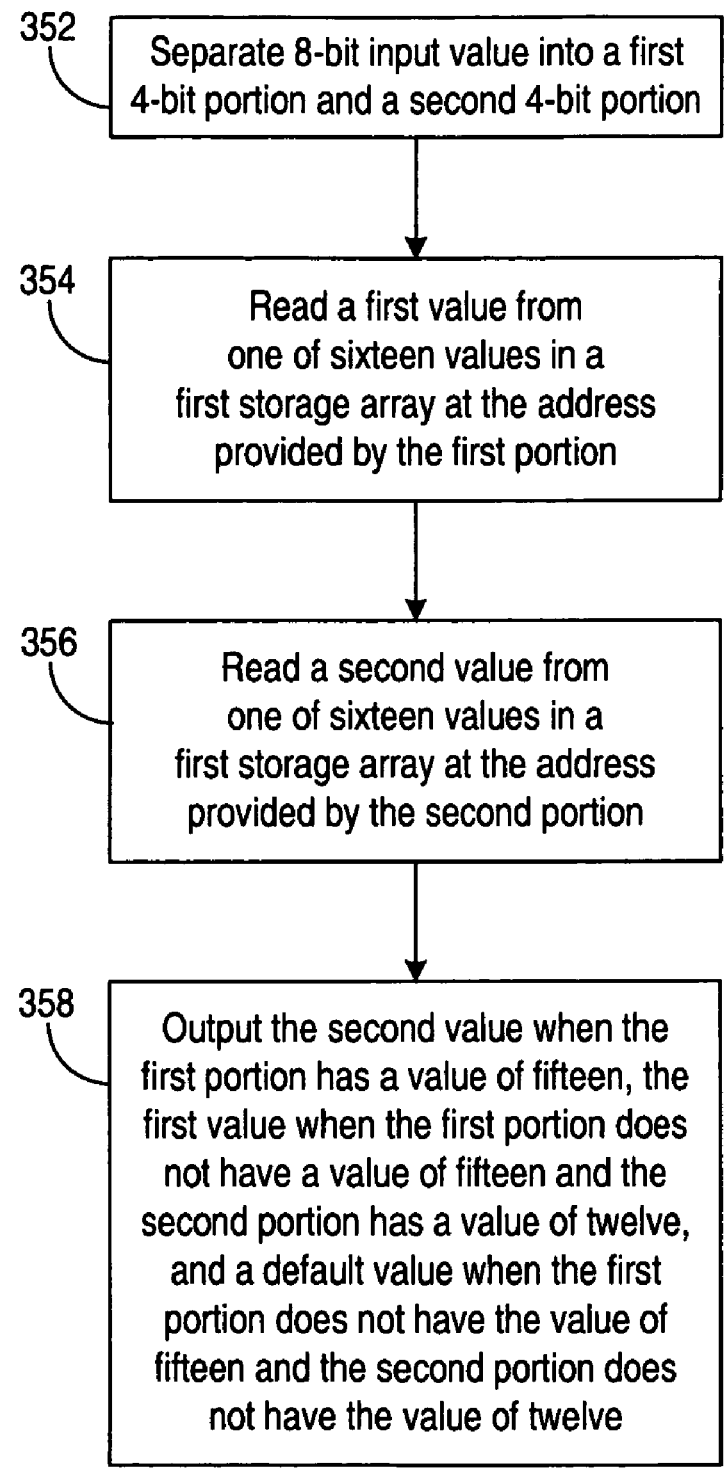
FIG. 6 is a flow diagram of a process for converting the format of a control character of an 8b/10b encoding in accordance with various embodiments of the invention.

FIG. 6 is a flow diagram of a process for converting the format of a control character of an 8b/10b encoding in accordance with various embodiments of the invention. At step 352, an 8-bit input value is separated into a first portion and a second portion, typically with the first portion being the four most significant bits of the 8-bit value and the second portion being the four least significant bits of the 8-bit value. At step 354, a first value is read from a first storage array at the address provided by the first portion. At step 356, a second value is read from a second storage array at the address provided by the second portion. Typically, the first and second storage arrays each store sixteen values.

At step 358, one of the first value from the first storage array, the second value from the second storage array, and a default value is output as the encoded value resulting from the format conversion. The default value is output when the 8-bit input value does not correspond to a valid control character of the 8b/10b encoding. Typically, the second value is output when the first portion has a value of fifteen, the first value is output when the first portion does not have a value of fifteen and the second portion has a value of twelve, and otherwise the default value is output. Typically, for an 8-bit value corresponding to a control character of the 8b/10b encoding, the value output is a 4-bit GFP value corresponding to the control character and for an 8-bit value that does not correspond to a control character of the 8b/10b encoding, the value output is the default value indicating an invalid control character.

The present invention is thought to be applicable to a variety of systems for encoding control characters. Other aspects and embodiments of the present invention will be apparent to those skilled in the art from consideration of the specification and practice of the invention disclosed herein. It is intended that the specification and illustrated embodiments be considered as examples only, with a true scope and spirit of the invention being indicated by the following claims.

What is claimed is:

1. An encoder, comprising:
   a first storage array configured with a first set of values and having an address port coupled to receive a first portion of an input value, the first array adapted to output a first value of the first set in response to a value of the first portion of the input value;
   a second storage array configured with a second set of values and having an address port coupled to receive a second portion of the input value, the second array adapted to output a second value of the second set in response to a value of the second portion of the input value; and
   a selection circuit having input ports coupled to the first storage array and the second storage array, the selection circuit adapted to output the second value from the second storage array as an encoded value of the input value in response to the first portion having a third value, and output the first value from the first storage array as the encoded value in response to the second portion having a fourth value.

2. The encoder of claim 1, wherein the input value is a value of a control character of an 8b/10b encoding and the encoded value is a generic framing procedure encoding of the control character.

3. The encoder of claim 1, wherein the encoder is implemented in configurable logic resources and configurable routing resources of a programmable logic device (PLD).

4. The encoder of claim 3, wherein the first and second storage arrays are each implemented on at least one look-up table (LUT) of the configurable logic resources of the PLD.

5. The encoder of claim 1, wherein the input value includes 8 bits, and the encoded value has 4 bits.

6. The encoder of claim 5, wherein the selection circuit outputs a default value as the encoded value in response to the first portion not having the third value and the second portion not having the fourth value.

7. The encoder of claim 6, wherein the third value is hexadecimal F and the fourth value is hexadecimal C.

8. The encoder of claim 7, wherein the default value is one of hexadecimal values C, D, E, and F.

9. The encoder of claim 8, wherein the encoder is implemented in configurable logic resources and configurable routing resources of a programmable logic device (PLD).

10. The encoder of claim 9, wherein the first and second storage arrays are each implemented on at least four look-up tables (LUTs) of the configurable logic resources of the PLD.

11. The encoder of claim 10, wherein the selection circuit is implemented on a plurality of LUTs of the PLD.

12. A method for encoding an 8-bit input value into an n-bit encoded value, wherein n is greater than or equal to four, comprising:
    reading from a first storage array, a first value addressed by a first portion of the 8-bit input value;
    reading from a second storage array, a second value addressed by a second portion of the 8-bit input value;
    outputting the second value as the n-bit encoded value in response to the first portion having a third value;
    outputting the first value as the n-bit encoded value in response to the first portion not having the third value and the second portion having a fourth value; and
    outputting a default value as the n-bit encoded value in response to the first portion not having the third value and the second portion not having the fourth value.

13. The method of claim 12, wherein the 8-bit input value corresponds to a control character of an 8b/10b encoding and the first and second portions are each a respective one of the four most significant bits of the control character and the four least significant bits of the control character.

14. The method of claim 13, wherein the third value is hexadecimal F.

15. The method of claim 14, wherein the fourth value is hexadecimal C.

16. The method of claim 13, wherein the n-bit encoded value is a 4-bit encoded value corresponding to a generic framing procedure encoding of a control character of the 8b/10b encoding and the default value is one of hexadecimal values C, D, E, and F.

17. An encoder for encoding an input value, comprising:
    means for addressably storing a first set of values;
    means for reading from the first set of values, a first value addressed by a first portion of the input value;
    means for addressably storing a second set of values;
    means for reading from the second set of values, a second value addressed by a second portion of the input value; and
    means, responsive to the first portion having a third value, for selecting as an encoded output value the second value, responsive to the first portion not having the third value and the second portion having a fourth value, for selecting the first value, and responsive to the first portion not having the third value and the second portion not having the fourth value, for selecting a default value.

* * * * *